United States Patent
Maegawa et al.

(10) Patent No.: US 12,035,498 B2
(45) Date of Patent: Jul. 9, 2024

(54) AIRTIGHT TERMINAL

(71) Applicant: SCHOTT AG, Mainz (DE)

(72) Inventors: Yusuke Maegawa, Koka (JP); Hiroki Honda, Koka (JP); Akira Fujioka, Koka (JP); Daisuke Fukushima, Koka (JP); Hiroyuki Kojima, Koka (JP)

(73) Assignee: SCHOTT AG, Mainz (DE)

( * ) Notice: Subject to any disclaimer, the term of this patent is extended or adjusted under 35 U.S.C. 154(b) by 290 days.

(21) Appl. No.: 17/621,212

(22) PCT Filed: Oct. 6, 2020

(86) PCT No.: PCT/JP2020/037865
§ 371 (c)(1),
(2) Date: Dec. 20, 2021

(87) PCT Pub. No.: WO2021/070817
PCT Pub. Date: Apr. 15, 2021

(65) Prior Publication Data
US 2022/0354012 A1    Nov. 3, 2022

(30) Foreign Application Priority Data

Oct. 8, 2019  (JP) ................................ 2019-184885
Oct. 1, 2020  (JP) ................................ 2020-166630

(51) Int. Cl.
*H05K 5/06*       (2006.01)
(52) U.S. Cl.
CPC ................................. *H05K 5/069* (2013.01)
(58) Field of Classification Search
CPC .................................................. H05K 5/069
See application file for complete search history.

(56) References Cited

U.S. PATENT DOCUMENTS 5,391,061 A      2/1995  Izuka et al.
11,417,970 B2*   8/2022  Fukushima ............. H01R 9/16
(Continued)

FOREIGN PATENT DOCUMENTS

CN    102678557 A    9/2012
CN    102678558 A    9/2012
(Continued)

OTHER PUBLICATIONS

[English Translation] Office Action mailed Jul. 18, 2023 in JP Application No. 2022-111556; pp. all.
(Continued)

*Primary Examiner* — Adrian S Wilson
(74) *Attorney, Agent, or Firm* — Dorsey & Whitney LLP

(57) ABSTRACT

[Problem] Provided is an airtight terminal that is configured to lessen distortion-borne stress caused in a metallic outer ring as a result of screw fastening or other fixing means to prevent the stress from readily propagating to an insulating material in a sealed place of a lead.

[Solution] An airtight terminal is provided that includes a metallic outer ring 13 having through holes 11 formed for screw fastening and sealing holes 12, leads 14 inserted through the sealing holes 12 in the metallic outer ring 13, and pieces of an insulating material 15 to seal gaps between the metallic outer ring 13 and the respective leads 14. The metallic outer ring 13 is provided with pairs of cavities 13*a* and steps 13*b* surrounding the respective sealing holes 12.

31 Claims, 8 Drawing Sheets

(56) References Cited

U.S. PATENT DOCUMENTS

2012/0018216 A1    1/2012    Harada et al.
2012/0228023 A1    9/2012    Fukasaku et al.

FOREIGN PATENT DOCUMENTS

| | | |
|---|---|---|
| CN | 104319118 A | 1/2015 |
| JP | S62124777 U | 8/1987 |
| JP | H04344707 A | 12/1992 |
| JP | H05263762 A | 10/1993 |
| JP | 2001093596 A | 4/2001 |
| JP | 2012186969 A | 9/2012 |
| WO | 2010117000 A1 | 10/2010 |

OTHER PUBLICATIONS

[English Translation] Office Action mailed Oct. 16, 2023 in KR Application No. 10-2021-7040634; pp. all.
[English Translation] Notice of Reasons for Refusal mailed on May 20, 2022 for Japanese Patent Application No. 2020-166630; pp. all.
English Translation of Written Opinion mailed on Apr. 12, 2022 for International Patent Application for PCT/JP2020/037865; pp. all.
International Preliminary Report on Patentability mailed on Apr. 21, 2022 for International Patent Application No. PCT/JP2020/037865; pp. all.
International Search Report and Written Opinion [English Translation for ISR only] dated Dec. 22, 2020 for PCT Application No. PCT/JP2020/037865.
[English Translation] Office Action mailed Apr. 29, 2023 in CN Application No. 202080054941.7; pp. all.

\* cited by examiner

AIRTIGHT TERMINAL

CROSS-REFERENCE TO RELATED APPLICATION(S)

This application is a U.S. National Stage of PCT Application No. PCT/JP2020/037865 filed Oct. 6, 2020, which claims priority to Japanese Application No. 2019-184885 filed Oct. 8, 2019 and Japanese Application No. 2020-166630 filed Oct. 1, 2020, which are incorporated herein by reference, in their entirety, for any purpose.

TECHNICAL FIELD

The present invention relates to an airtight terminal including an airtight terminal for an automotive electric compressor.

BACKGROUND ART

An airtight terminal is configured by hermetically sealing a metallic outer ring (also referred to as an eyelet) and a lead in a through hole in the metallic outer ring with a glass insulating material, and airtight terminals are used to supply current to electrical devices or elements housed in airtight containers and guide signals outside from the electrical devices or the elements. For instance, as shown in WO 2010/117000 (Patent Literature 1), an airtight terminal used for a compressor in an apparatus such as a refrigerator or an air conditioner has a metallic outer ring that includes a top plate, a cylindrical portion extending downward from an outer peripheral end of the top plate, a flange widening obliquely outward from a lower end of the cylindrical portion, and three small tubular portions forming respective lead sealing holes extending internally from the top plate. Sealed leads are hermetically sealed in the lead sealing holes in the metallic outer ring with respective pieces of a glass insulating material for sealing.

In recent years, car air conditioners for electric vehicles and hybrid vehicles have been equipped with electric compressors that have built-in electric motors in iron-made containers. Airtight terminals have been adopted for electric compressors for automotive application. Electric compressors for automotive application have a compression mechanism similar to that of electric compressors for indoor air conditioning. As for the disposition of machinery in the engine room of hybrid vehicles and electric vehicles, in response to demand for vehicle weight reduction and other improvements, when devices are disposed in the engine room, it is being tried to save space to the utmost degree. This has created a situation in which it is difficult to secure an enough space for installation of the electric compressor in the engine room. Thus, the airtight terminal for the electric compressor for automotive application as is disclosed, for example, in Patent Literature 2 has a configuration in which three terminals are arranged linearly and a size around a socket and other parts is small rather than a configuration of the airtight terminal for indoor air conditioning in which three terminals are arranged at 120° intervals on a circumference of an identical circle.

DOCUMENT LIST

Patent Literatures

Patent Literature 1: International Application No. WO 2010/117000

Patent Literature 2: Japanese Patent Application Publication No. 2012-186969

SUMMARY OF INVENTION

Technical Problem

In hybrid vehicles and electric vehicles, in a similar way to indoor air conditioners, compressors driven by electric motors, i.e., a compressor with a built-in electric motor that has both a compression mechanism and an electric motor incorporated in an airtight container are equipped, rather than compressors driven by engines. These electric compressors for automotive application are preferably more space-saving, smaller, and lighter as much as possible in consideration of installation in narrow engine rooms. Since the electric motor drives the compressor through the airtight terminal attached to an attachment hole in the airtight container, leads of most airtight terminals used for such compressors are arranged in one series line to be advantageous in space saving. The airtight terminal for automotive electric compressors is fixed to the attachment hole in the airtight container housing the electric motor by screw fastening or resistance welding. The airtight container, to which the airtight terminal described above is attached, swells due to refrigerant-related internal pressure, and this causes distortion to the airtight terminal. Moreover, when the airtight terminal is fastened to the airtight container with screws, torque of the screw fastening causes the metallic outer ring to be infinitesimally deformed into a bow and be distorted. Conventionally, the airtight terminal is attached to the airtight container with excessive distortion stress added to a sealed place of any of the leads. This can cause a crack or a chip in insulating glass forming the sealed place of the lead and have an adverse effect on airtightness and electrical properties.

Concerning airtight terminals including an airtight terminal for an automotive electric compressor, an object of the present invention is to provide an airtight terminal that is configured to lessen distortion-borne stress caused in a metallic outer ring as a result of screw fastening, welding, or other fixing means to prevent the stress from readily propagating to an insulating material in a sealed place of a lead.

Solution to Problem

According to the present invention, an airtight terminal includes a metallic outer ring having at least one sealing hole; a lead inserted through the sealing hole in the metallic outer ring; and an insulating material to hermetically seal a gap between the metallic outer ring and the lead is provided, wherein the metallic outer ring includes either of a step having a cavity formed around the sealing hole and a groove formed around the sealing hole. Even if torque produced by screw fastening causes distortion to the metallic outer ring, the step having the cavity or the groove formed around the sealing hole is designed to elastically alleviate and lessen distortion stress. This can prevent the distortion stress from propagating to the insulating material in the sealed place of the lead. The airtight terminal of the present invention can be attached to an airtight container for a compressor by screw fastening, resistance welding, or other means in a similar way to the conventional technique, thus providing substantially improved robustness. Further, the airtight terminal readily ensures airtightness even if the metallic outer ring is exposed to varying torque due to screw fastening.

Effects of Invention

According to the embodiment of the present invention, the airtight terminal provides improved reliability.

DESCRIPTION OF EMBODIMENTS

Figure 1A:
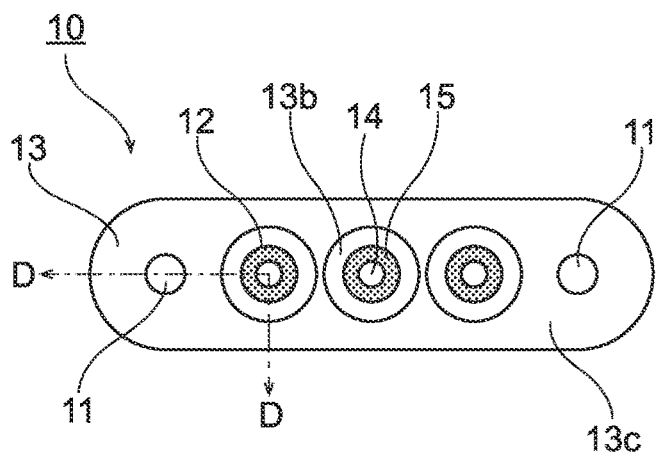
FIG. 1A A plan view illustrating an airtight terminal 10 according to the present invention.
Figure 1B:
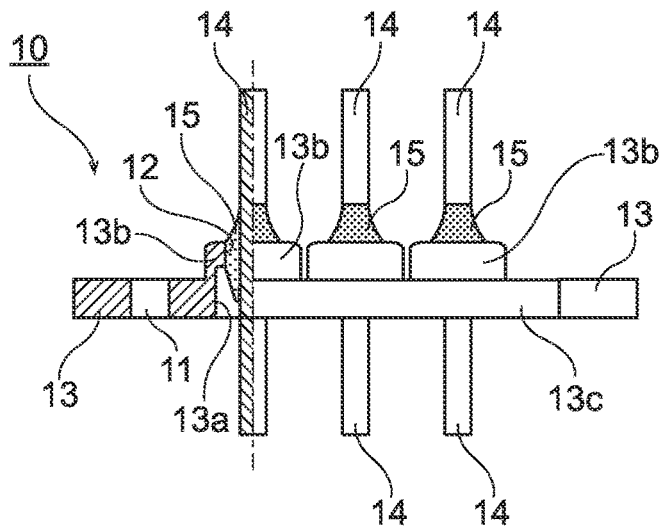
FIG. 1B A partial cross-sectional elevation view taken along line D-D in the plan view 1A illustrating an airtight terminal 10 according to the present invention.
Figure 1D:
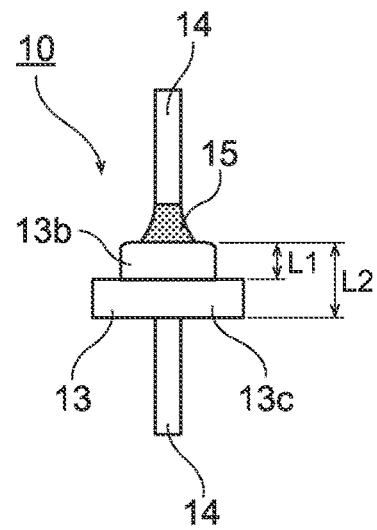
FIG. 1D A side view illustrating an airtight terminal 10 according to the present invention.
Figure 1C:
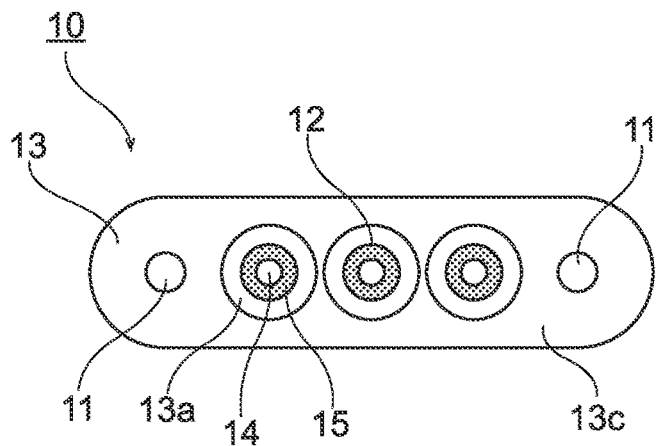
FIG. 1C A bottom view illustrating an airtight terminal 10 according to the present invention.
Figure 2A:
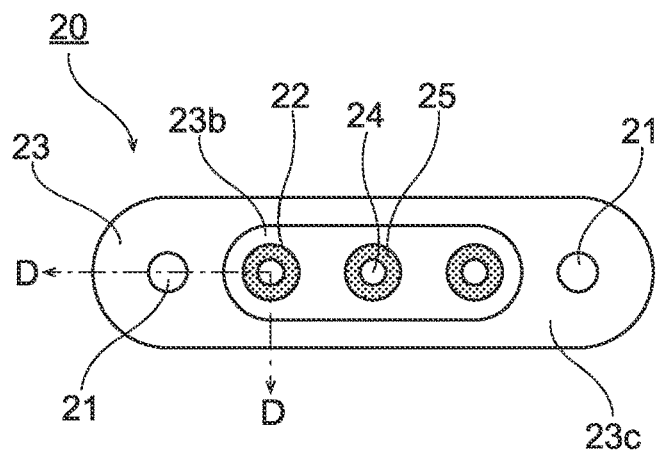
FIG. 2A A plan view illustrating an airtight terminal 20 according to the present invention.
Figure 2B:
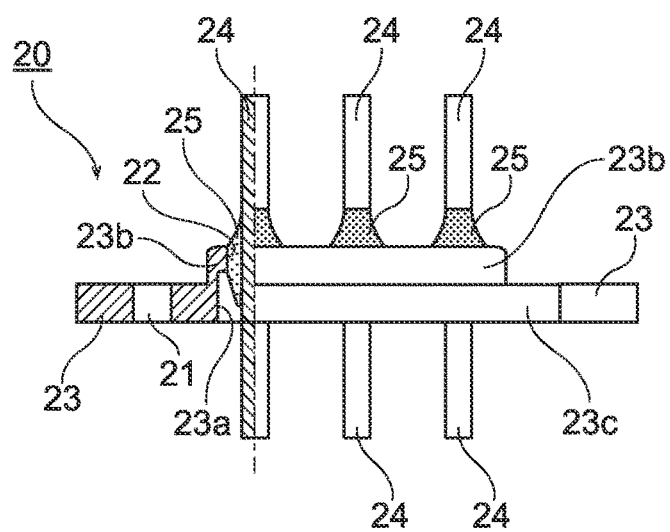
FIG. 2B A partial cross-sectional elevation view taken along line D-D in the plan view 2A illustrating an airtight terminal 20 according to the present invention.
Figure 2D:
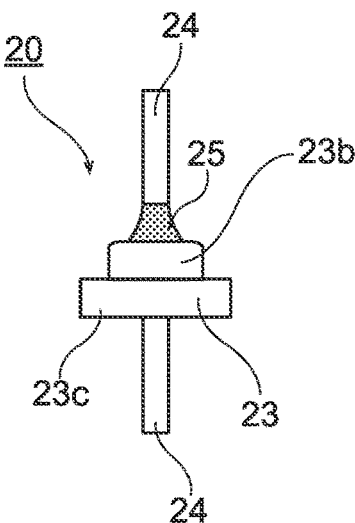
FIG. 2D A side view illustrating an airtight terminal 20 according to the present invention.
Figure 2C:
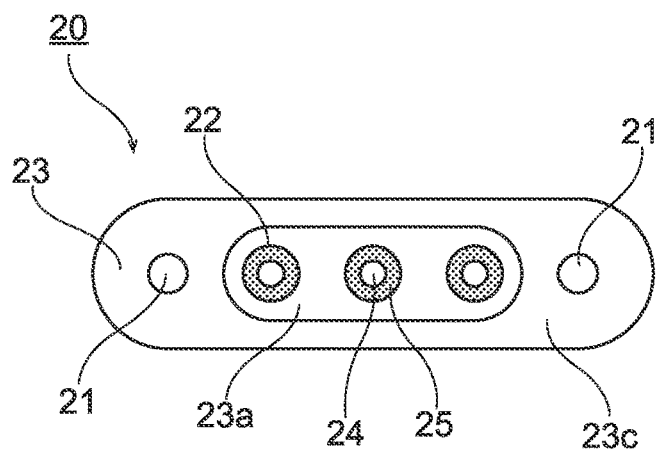
FIG. 2C A bottom view illustrating an airtight terminal 20 according to the present invention.
Figure 3A:
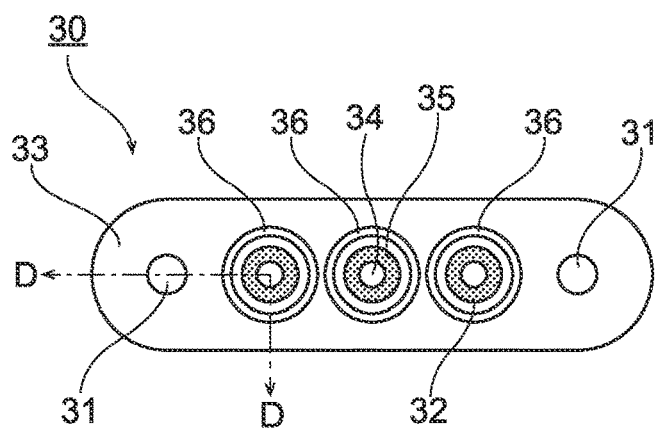
FIG. 3A A plan view illustrating an airtight terminal 30 according to the present invention.
Figure 3B:
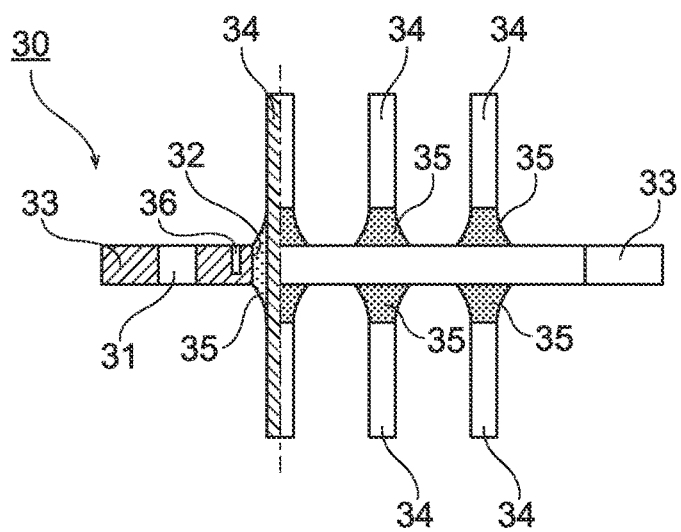
FIG. 3B A partial cross-sectional elevation view taken along line D-D in the plan view 3A illustrating an airtight terminal 30 according to the present invention.
Figure 3D:
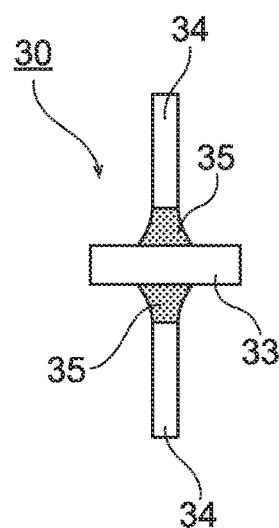
FIG. 3D A side view illustrating an airtight terminal 30 according to the present invention.
Figure 3C:
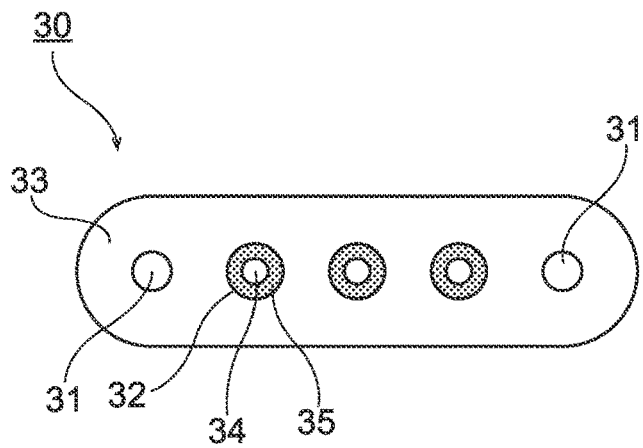
FIG. 3C A bottom view illustrating an airtight terminal 30 according to the present invention.
Figure 4A:
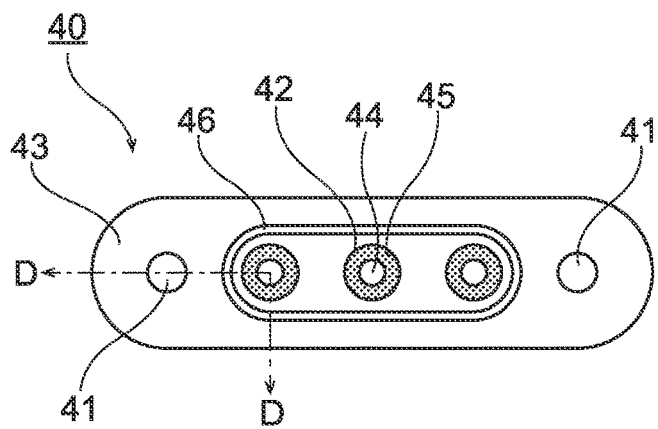
FIG. 4A A plan view (a), a partial cross-sectional elevation view (b) taken along line D-D in the plan view (a), a bottom view (c), and a side view (d), illustrating an airtight terminal 40 according to the present invention.
Figure 4B:
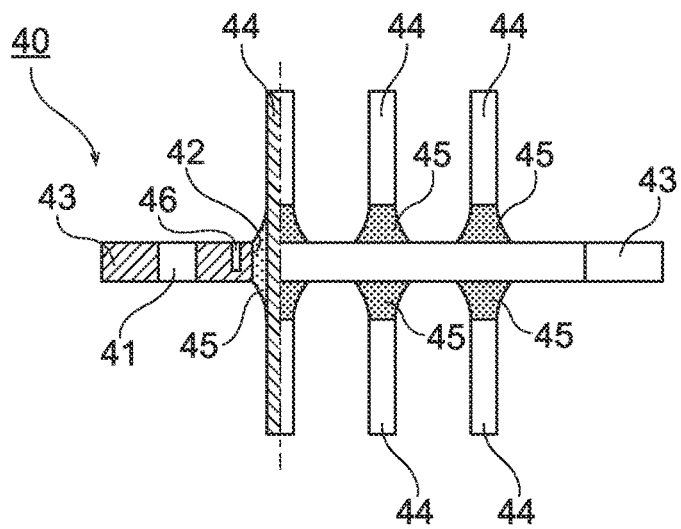
FIG. 4B A partial cross-sectional elevation view taken along line D-D in the plan view 4A illustrating an airtight terminal 40 according to the present invention.
Figure 4D:
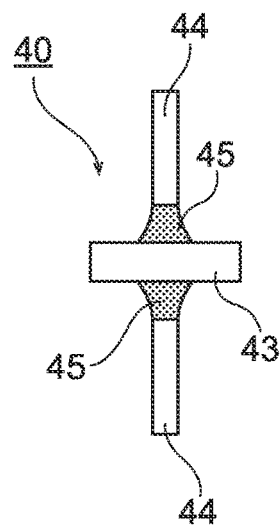
FIG. 4D A side view illustrating an airtight terminal 40 according to the present invention.
Figure 4C:
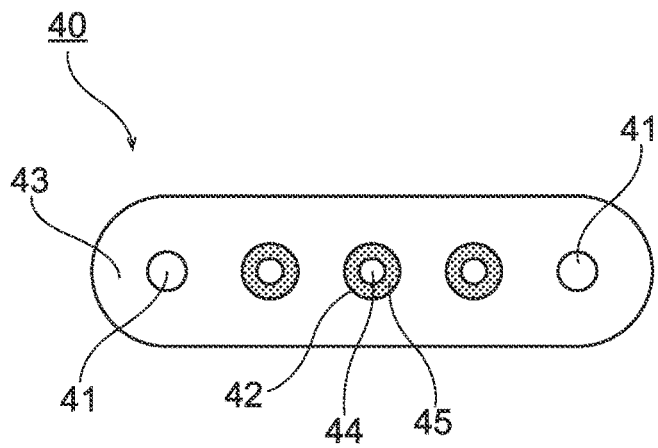
FIG. 4C A bottom view illustrating an airtight terminal 40 according to the present invention.

An airtight terminal according to the present invention, as illustrated in FIGS. 1A to 4D, includes a metallic outer ring having at least one sealing hole; a lead inserted through the sealing hole in the metallic outer ring; and an insulating material configured to seal a gap between the metallic outer ring and the lead, wherein the metallic outer ring includes either of a step having a cavity formed around the sealing hole and a groove formed around the sealing hole. The step or the groove is formed so as to surround the lead and the sealing hole in the airtight terminal. If the airtight terminal includes pluralities of the leads and the sealing holes, the steps or the grooves may be formed so as to surround the respective sealing holes, for example as illustrated in FIGS. 1A to 1D and 2A to 2D, or the step or the groove may be formed so as to surround the plurality of the sealing holes as a whole, for example as illustrated in FIGS. 3A to 3D. The groove described above may be formed into a continuous circular circumference so as to surround the sealing hole without a gap or may be made up of a plurality of arc-shaped grooves disposed so as to surround the sealing hole intermittently, with the proviso that the groove is formed so as to surround the sealing hole.

In an aspect of the airtight terminal according to the present invention, the step having the above-described cavity is formed so as to protrude beyond a flat surface of the metallic outer ring. Even if screw fastening causes distortion to the flat surface of the metallic outer ring when the airtight terminal is fixed to an attachment part of an electrical device to which the airtight terminal is attached by screw fastening or other means, stress owing to the distortion is absorbed and is lessened by the step having the cavity and is thus prevented from propagating to the insulating material hermetically sealing the gap between the lead and the metallic outer ring. In an aspect of the airtight terminal according to the present invention, the groove described above is formed such that part of a flat surface of the metallic outer ring is cut out. Even if screw fastening causes distortion to the flat surface of the metallic outer ring when the airtight terminal is fixed to an attachment part of an electrical device to which the airtight terminal is attached by screw fastening or other means, stress owing to the distortion is absorbed and is lessened by the groove and is thus prevented from propagating to the insulating material hermetically sealing the gap between the lead and the metallic outer ring. Either of the step and the groove may be formed so as to surround plurality of the leads and the sealing holes as a whole, with the proviso that either of the step and the groove is formed so as to surround all the leads and the sealing holes in the airtight terminal.

The airtight terminal according to the present invention may further include an insulating, coat put on a surface of the metallic outer ring. A material that the insulating coat is made of is not particularly limited and may be any insulating material. Examples of the insulating material preferably include rubber, elastomers, plastics, ceramics, and glass.

Although this specification illustrates airtight terminals each having three terminals, the scope of the present invention should not be limited to the illustrated airtight terminals but may include airtight terminals in any forms with the proviso that the airtight terminal has an outer ring and a lead that is sealed with a glass material in the outer ring.

As illustrated in FIGS. 1A to 1D, an airtight terminal 10 of the present invention includes a metallic outer ring 13 having through holes 11 formed for screw fastening and sealing holes 12, leads 14 inserted through the sealing holes 12 in the metallic outer ring 13, and pieces of an insulating material 15 to seal gaps between the metallic outer ring 13 and the respective leads 14, wherein the metallic outer ring 13 includes pairs of cavities 13a and steps 13b surrounding the respective sealing holes 12. The pairs of the cavities 13a and the steps 13b are formed so as to surround outer peripheries of respective pairs of the pieces of the insulating material 15 sealing the leads 14 and the sealing holes 12 in the metallic outer ring 13. Every pair of the cavity 13a and the step 13b is formed such that part of the metallic outer ring 13 protrudes and a back side of the protruding part constitutes a cavity having a recessed surface. When the airtight terminal 10 is attached to a component such as an electrical device, the cavities 13a and the steps 13b are formed so as to protrude beyond a flat surface of the metallic outer ring 13. Even if screw fastening causes distortion to the flat surface of the metallic outer ring 13 when the airtight terminal is fixed to an attachment part of the electrical device to which the airtight terminal is attached by screw fastening or other means, the pieces of the insulating material 15 sealing, the gaps between the sealing holes 12 and the leads 14 are disposed inside zones surrounded by the respective pairs of the cavities 13a and the steps 13b and thus distortion stress from the metallic outer ring 13 is elastically absorbed and is lessened by being bended a protruding wall surface formed by each pair of the cavity 13a and the step 13b to prevent the distortion stress from propagating to the pieces of the insulating material 15 hermetically sealing the gaps between the leads 14 and the metallic outer ring 13. The through holes 11 are formed to fasten and fix the airtight terminal of the present invention to an airtight container or another housing of the electrical device by screw fastening or other means.

As illustrated in FIGS. 2A to 2D, an airtight terminal 20 of the present invention includes a metallic outer ring 23 having through holes 21 formed for screw fastening and sealing holes 22, leads 24 inserted through the sealing holes 22 in the metallic outer ring 23, and pieces of an insulating material 25 to seal gaps between the metallic outer ring 23 and the respective leads 24, wherein the metallic outer ring 23 includes a cavity 23a and a step 23b each surrounding the sealing holes. The cavity 23a and the step 23b are formed so as to surround outer peripheries of the pieces of the insulating material 25 sealing the leads 24 and the sealing holes 22 as a whole in the metallic outer ring 23. The cavity 23a and the step 23b are formed such that part of the metallic outer ring 23 protrudes and a back side of the protruding part constitutes a cavity having a recessed surface. When the airtight terminal 20 is attached to a component such as an electrical device, the cavity 23a and the step 23b are formed so as to protrude beyond a flat surface of the metallic outer ring 23. Even if screw fastening causes distortion to the flat surface of the metallic outer ring 23 when the airtight terminal is fixed to an attachment part of the electrical device to which the airtight terminal is attached by screw fastening or other means, the pieces of the insulating material 25 sealing the gaps between the sealing holes 22 and the leads 24 are disposed inside a zone surrounded by the cavity 23a and the step 23b and thus distortion stress from the metallic outer ring 23 is elastically absorbed and is lessened by being bended a protruding wall surface formed by the cavity 23a and the step 23b to prevent the distortion stress from propagating to the pieces of the insulating material 25 hermetically sealing the gaps between the leads 24 and the metallic outer ring 23. The through holes 21 are formed to fasten and fix the airtight terminal of the present invention to an airtight container or another housing of the electrical device by screw fastening or other means.

Figure 5A:
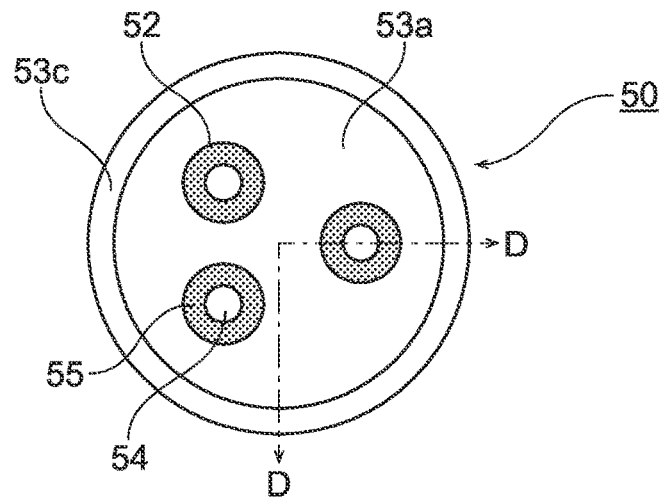
FIG. 5A A plan view illustrating an airtight terminal 50 according to the present invention.
Figure 5B:
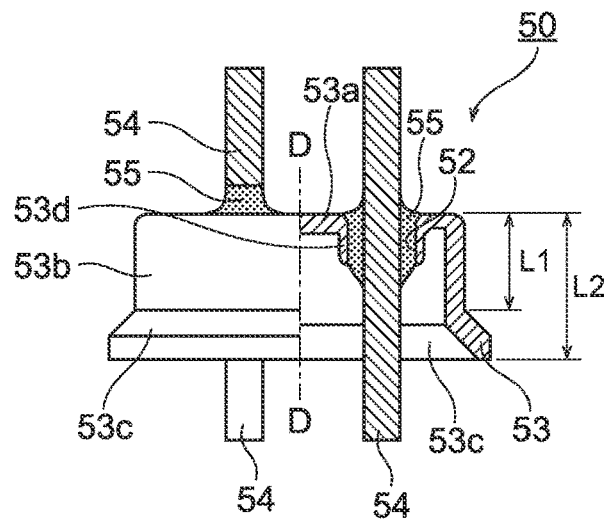
FIG. 5B A partial cross-sectional elevation view taken along line D-D in the plan view 5A illustrating an airtight terminal 50 according to the present invention.
Figure 5C:
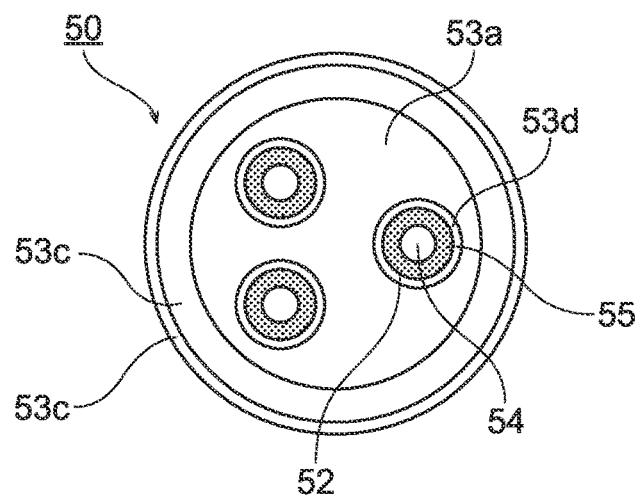
FIG. 5C A bottom view illustrating an airtight terminal 50 according to the present invention.
Figure 6A:
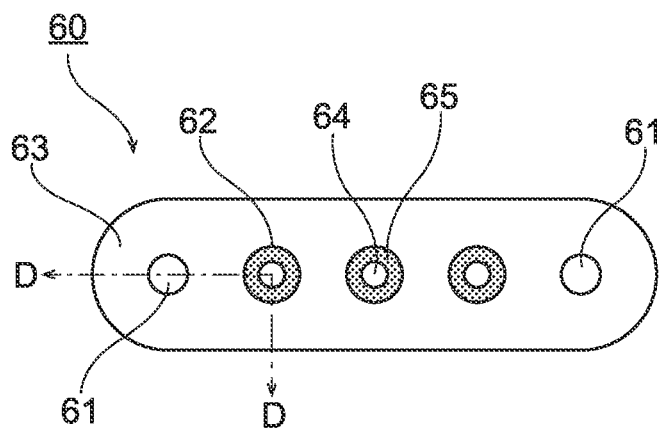
FIG. 6A A plan view illustrating an airtight terminal 60 according to the present invention.
Figure 6B:
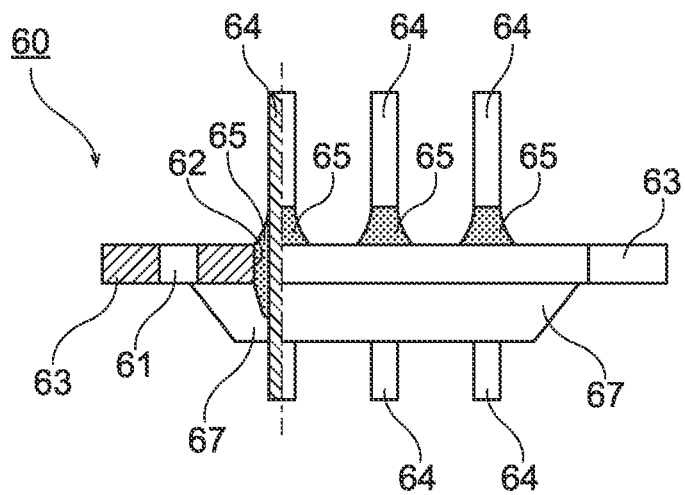
FIG. 6B A partial cross-sectional elevation view taken along line D-D in the plan view 6A illustrating an airtight terminal 60 according to the present invention.
Figure 6D:
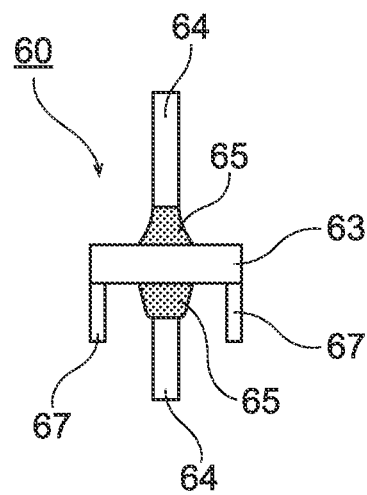
FIG. 6D A side view illustrating an airtight terminal 60 according to the present invention.
Figure 6C:
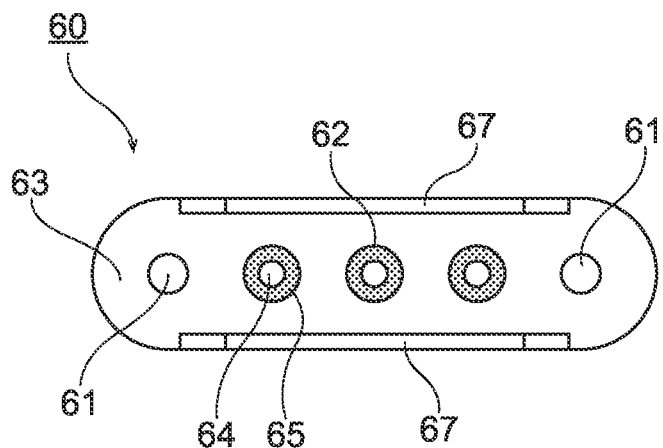
FIG. 6C A bottom view illustrating an airtight terminal 60 according to the present invention.
Figure 7A:
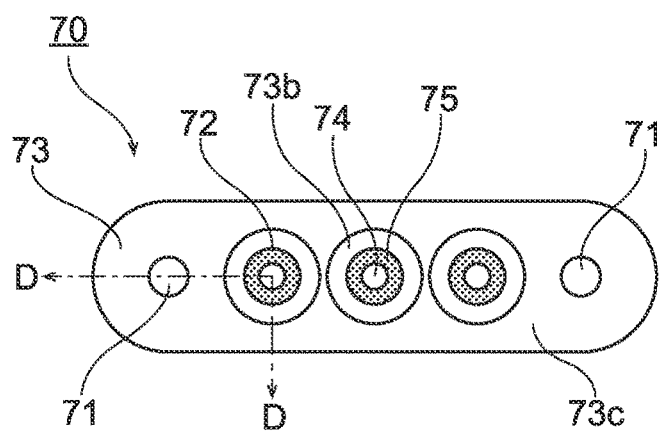
FIG. 7A A plan view illustrating an airtight terminal 70 according to the present invention.
Figure 7B:
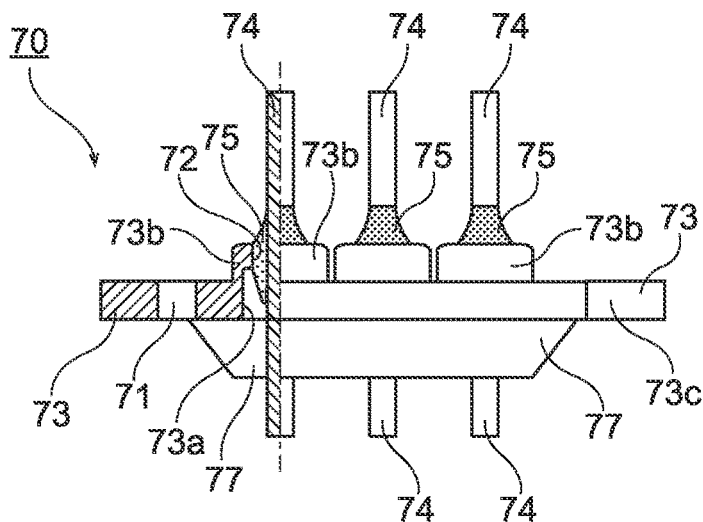
FIG. 7B A partial cross-sectional elevation view taken along line D-D in the plan view 7A illustrating an airtight terminal 70 according to the present invention.
Figure 7D:
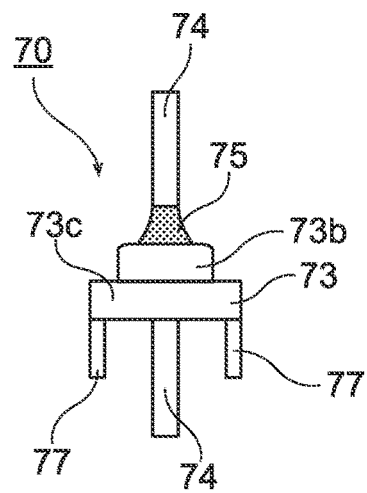
FIG. 7D A side view illustrating an airtight terminal 70 according to the present invention.
Figure 7C:
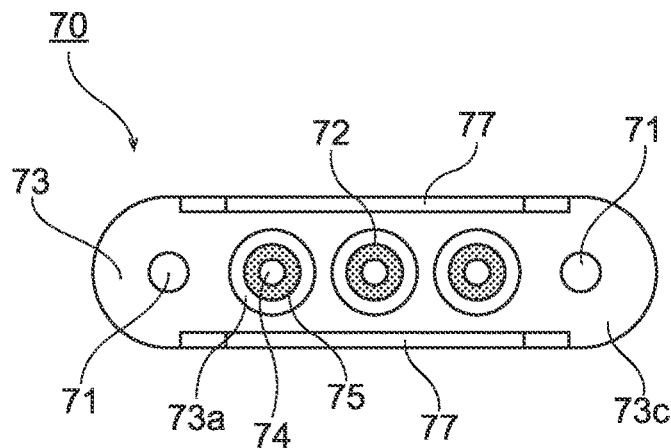
FIG. 7C A bottom view illustrating an airtight terminal 70 according to the present invention.

The airtight terminal is subject to a load caused by internal pressure-related deformation of a pressure container (an airtight container) to which the airtight terminal is attached and a load caused by distortion created, for example, as a result of attachment of the airtight terminal by resistance welding or screw fastening. To prevent the loads from spreading to the insulating material in a sealed place in the airtight terminal, it is important for the step to have a satisfactory distance between a top plate of the metallic outer ring having the lead sealing, holes and a flange of the metallic outer ring that is a base for attachment to the airtight container. For instance, a disc-shaped airtight terminal for compressors, as illustrated in FIGS. 5A to 5C, has a metallic outer ring 53 having a cup shape and including, as one body, a top plate 53a, a cylindrical portion 53b extending downward from an outer peripheral end of the top plate 53a, a flange 53c widening obliquely outward from a lower end of the cylindrical portion 53b, and small tubular portions 53d forming respective lead sealing holes 52 and extending internally into the cup-shaped metallic outer ring from the top plate 53a, and leads 54 that are sealed in the respective lead sealing holes 52 in the metallic outer ring 53 with insulating materials 55 made of glass or an epoxy resin. Conventionally, a ratio of a height $L1$ of the cylindrical portion 53b to an overall height $L2$ of the metallic outer ring from a bottom face of the flange 53c to the top plate 53a is about 0.6 when the overall height $L2$ is 1. To prevent the loads caused by deformation and distortion described above from spreading to the insulating material in the sealed place in the airtight terminal, the ratio of the height $L1$ of the cylindrical portion 53b to the overall height $L2$ of the metallic outer ring from the bottom face of the flange 53c to the top plate 53a preferably ranges from 0.7 to 0.9 inclusive and more preferably ranges from 0.7 to 0.8 inclusive when the overall height $L2$ is 1. The cylindrical portion 53b that is greater in height than the conventional cylindrical portion allows the airtight terminal to be attached to a case of a compressor, with the sealed places of the terminal kept apart from the case. The airtight terminal 50 is attached to an airtight container of a compressor by resistance welding and is used. The metallic outer ring 53 absorbs distortion stress caused by deformation of the airtight container to prevent the distortion stress from propagating to the insulating materials 55 and hinders occurrence of a fault such as a crack or a chip in the insulating materials 55.

As illustrated with the airtight terminal 10 in FIGS. 1A to 1D, a ratio of a height $L1$ of the cavity of the airtight terminal according to the present invention to an overall height $L2$ of the metallic outer ring from a bottom face of the metallic outer ring 13 to an external end of the cavity 13a preferably ranges from 0.7 to 0.9 inclusive and more preferably ranges from 0.7 to 0.8 inclusive, for example, when the overall height $L2$ is 1. The ratio of the height of the cavity 13a to the overall height is set to a ratio within the range described above to allow the airtight terminal to be attached to a case of a compressor, with the sealed places of the terminal kept apart from the case. The airtight terminal of the present invention is attached to an airtight container of a compressor by screw fastening or resistance welding and is used. The metallic outer ring absorbs distortion stress caused by deformation of the airtight container to prevent the distortion stress from propagating to the insulating material and hinders occurrence of a fault such as a crack or a chip in the insulating material. If the ratio of the height of the cavity 13a to the overall height is lower than 0.7, the distance from the case of the compressor is short, and hence the insulating material can be affected by stress owing to deformation of the airtight container. If the ratio of the height L1 of the cavity 13a is higher than 0.9, a thickness of a flange 13c is relatively thin and the airtight terminal may be unable to satisfactorily withstand welding or screw fastening. The higher ratio can cause a dimension of the outward protruding part of the metallic outer ring 13 to be excessive such that the cavity 13a constitutes an obstacle and can result in waste such as an unnecessarily long lead 14 inside the cavity 13a.

As illustrated in FIGS. 3A to 3D, an airtight terminal 30 of the present invention includes a metallic outer ring 33 having through holes 31 formed for screw fastening and sealing holes 32, leads 34 inserted through the sealing holes 32 in the metallic outer ring 33, and pieces of an insulating material 35 to seal gaps between the metallic outer ring 33 and the respective leads 34, wherein the metallic outer ring 33 includes grooves 36 surrounding the respective sealing holes 32. The grooves 36 are formed so as to surround outer peripheries of respective pairs of the pieces of the insulating material 35 sealing the leads 34 and the sealing holes 32 in the metallic outer ring 33. When the airtight terminal 30 is attached to a component such as an electrical device, the grooves 36 are each formed such that part of a flat surface of the metallic outer ring 33 is cut out. Even if screw fastening causes distortion to the flat surface of the metallic outer ring 33 when the airtight terminal is fixed to an attachment part of the electrical device to which the airtight terminal is attached by screw fastening or other means, the pieces of the insulating material 35 sealing the gaps between the sealing holes 32 and the leads 34 are disposed inside zones surrounded by the respective grooves 36 and thus distortion stress from the metallic outer ring 33 is elastically absorbed and is lessened by being bended an inner wall surface of each of the grooves to prevent the distortion stress from propagating to the pieces of the insulating material 35 hermetically sealing the gaps between the leads 34 and the metallic outer ring 33. The through holes 31 are formed to fasten and fix the airtight terminal of the present invention to an airtight container or another housing of the electrical device by screw fastening or other means.

As illustrated in FIGS. 4A to 4D, an airtight terminal 40 of the present invention includes a metallic outer ring 43 having through holes 41 formed for screw fastening and sealing holes 42, leads 44 inserted through the sealing holes 42 in the metallic outer ring 43, and pieces of an insulating material 45 to seal gaps between the metallic outer ring 43 and the respective leads 44, wherein the metallic outer ring 43 includes a groove surrounding the sealing holes 42. The groove 46 is formed so as to surround outer peripheries of the pieces of the insulating material 45 sealing the leads 44 and the sealing holes 42 as a whole in the metallic outer ring 43. When the airtight terminal 40 is attached to a component such as an electrical device, the groove 46 is formed such that part of a flat surface of the metallic outer ring 43 is cut out. Even if screw fastening causes distortion to the flat surface of the metallic outer ring 43 when the airtight terminal is fixed to an attachment part of the electrical device to which the airtight terminal is attached by screw fastening or other means, all the pieces of the insulating material 45 sealing the gaps between the sealing holes 42 and the leads 44 are disposed inside a zone surrounded by the groove 46 and thus distortion stress from the metallic outer ring 43 is elastically absorbed and is lessened by being bended an inner wall surface of the groove 46 to prevent the distortion stress from propagating to the pieces of the insulating material 45 hermetically sealing the gaps between the leads 44 and the metallic outer ring 43. The through holes 41 are formed to fasten and fix the airtight terminal of the present invention to an airtight container or another housing of the electrical device by screw fastening or other means.

As illustrated in FIGS. 5A to 5C, the airtight terminal 50 according to the present invention has the metallic outer ring 53 having a cup shape and including, as one body, the top plate 53a, the cylindrical portion 53b extending downward from the outer peripheral end of the top plate 53a, the flange 53c widening obliquely outward from the lower end of the cylindrical portion 53b, and the small tubular portions 53d forming the respective lead sealing holes 52 and extending internally into the cup-shaped metallic outer ring from the top plate 53a, and the leads 54 that are sealed in the respective lead sealing holes 52 in the metallic outer ring 53 with the insulating materials 55 made of glass or an epoxy resin, wherein the height L1 of the cylindrical portion 53b, when the overall height L2 of the metallic outer ring from the bottom face of the flange 53c to the top plate 53a is 1, preferably ranges from 0.7 to 0.9 inclusive and more preferably ranges from 0.7 to 0.8 inclusive. The ratio of the height L1 of a conventional cylindrical portion 53b to the overall height L2 of the metallic outer ring from the bottom face of the flange 53c to the top plate 53a is about 0.6 when the overall height L2 is 1. The cylindrical portion 53b that is greater in height than the conventional cylindrical portion allows the airtight terminal to be attached to a case of a compressor, with the sealed places of the terminal kept apart from the case.

As illustrated in FIGS. 6A to 6D, an airtight terminal 60 according to the present invention includes a metallic outer ring 63 having through holes 61 formed for screw fastening and sealing holes 62, leads 64 inserted through the sealing holes 62 in the metallic outer ring 63, and pieces of an insulating material 65 to seal gaps between the metallic outer ring 63 and the respective leads 64, wherein the metallic outer ring 63 includes an extended portion 67 having a shape of a frame or a beam and extending partially or entirely on an outer periphery of the metallic outer ring 63 surrounding the sealing holes 62. The extended portion 67 in the shape of a frame is formed in outer peripheral portions of both the pieces of the insulating material 65 sealing the leads 64 and the sealing holes 62 in the metallic outer ring 63. When the airtight terminal 60 is attached to an airtight container of an electric compressor, the extended portion 67 reinforces the metallic outer ring 63 by presenting a reaction to a deformation in a direction along a flat surface of the metallic outer ring (in a horizontal direction). As a result, even if screw fastening causes distortion to the flat surface of the metallic outer ring 63 when the airtight terminal is fixed to an attachment part of an electrical device to which the airtight terminal is attached by screw fastening or other means, the leads 64 and the pieces of the insulating material 65 are disposed inside the extended portion 67, and this prevents the distortion from propagating to the pieces of the insulating material.

As illustrated in FIGS. 7A to 7D, an airtight terminal 70 according to the present invention includes a metallic outer ring 73 having through holes 71 formed for screw fastening and sealing holes 72, leads 74 inserted through the sealing holes 72 in the metallic outer ring 73, and pieces of an insulating material 75 to seal gaps between the metallic outer ring 73 and the respective leads 74, wherein the metallic outer ring 73 includes pairs of cavities 73a and steps 73b surrounding the respective sealing holes 72, or a groove (see FIGS. 4A to 4D for the above-described groove) surrounding the sealing holes 72, and an extended portion 77 having a shape of a frame or a beam and extending partially or entirely on an outer periphery of the metallic outer ring 73. The cavities 76 are formed so as to surround outer peripheries of respective pairs of the pieces of the insulating material 75 sealing the leads 74 and the sealing holes 72 in the metallic outer ring 73. The cavities 76 and the extended portion 77 are included in the metallic outer ring 73 when the airtight terminal 70 is attached to an airtight container of an electric compressor. Even if screw fastening causes distortion to a flat surface of the metallic outer ring 73 when the airtight terminal is fixed to an attachment part of an electrical device to which the airtight terminal is attached by screw fastening or other means, the sealing holes 72 and all the pieces of the insulating material 75 sealing the leads 74 are disposed inside zones surrounded by the respective cavities 76 and the metallic outer ring is reinforced by the extended portion 77. Thus, distortion stress from the metallic outer ring 73 does not cause the cavities 76 to be excessively deformed and loose effect. As a result, the distortion stress is elastically absorbed and is lessened by being bended an inner wall surface of each of the cavities 76 to prevent the distortion stress from propagating to the pieces of the insulating material 75 hermetically sealing the gaps between the leads 74 and the metallic outer ring 73.

Figure 8:
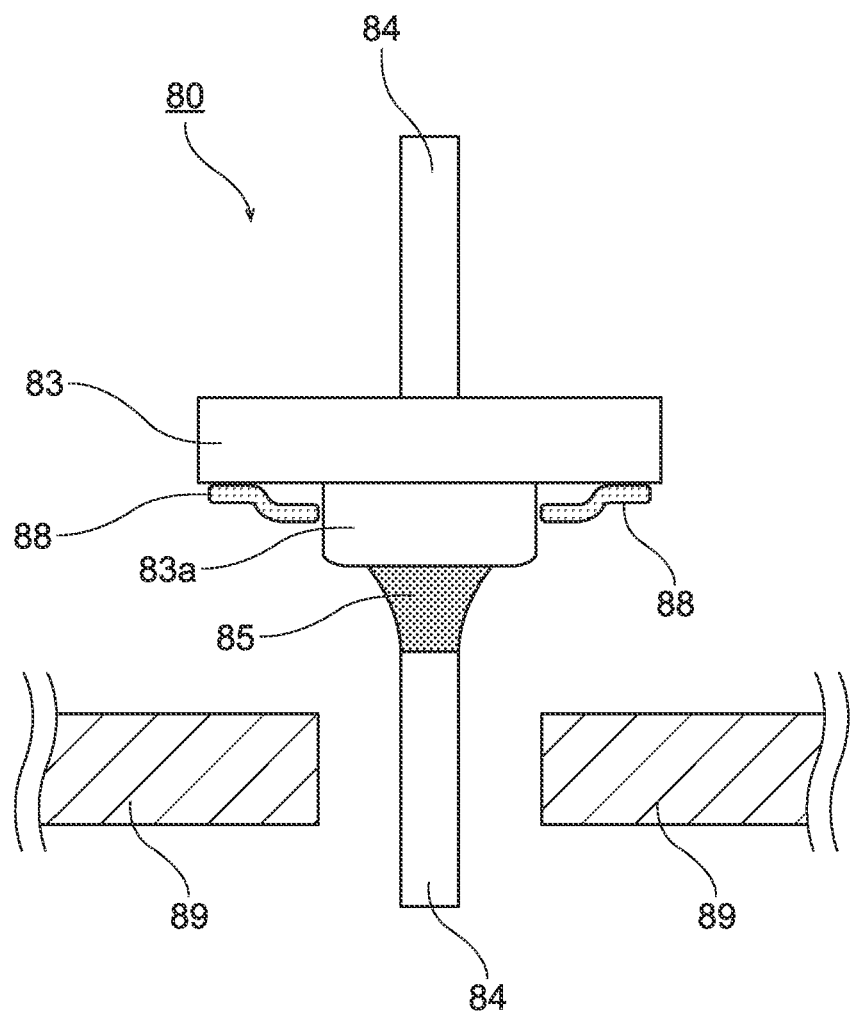
FIG. 8 A side view of an airtight terminal 80 according to the present invention and a partial cutaway view illustrating a gasket attached to the airtight terminal and an airtight container.

In the airtight terminal 10, the airtight terminal 20, and the airtight terminal 70 each having the cavity according to the present invention, like an airtight terminal 80 illustrated in FIG. 8, a protruding surface of a cavity 83a may be used as a surface to which a gasket 88 and an airtight container 89 of an electrical device are attached when the gasket 88 is attached to the airtight terminal. This allows the cavity 83a to double as a guide for positioning the gasket 88. This eliminates the need for a positioning projection that is conventionally formed on a metallic outer ring.

The airtight terminal with the cavity and the airtight terminal with the groove according to the present invention are not restricted in terms of a direction in which the airtight terminal is placed, unless otherwise particularly specified. Either side of the metallic outer ring can be used for being fixed.

EXAMPLES

As illustrated in FIGS. 1A to 1D, an airtight terminal 10 of Example 1 according to the present invention includes a metallic outer ring 13 made of alloy steel, a plurality of leads 14 made of an Fe—Cr iron-base alloy, and insulating materials 15 made of soda barium glass to seal gaps between the metallic outer ring 13 and the respective leads 14. The metallic outer ring 13 has through holes 11 formed for screw fastening and a plurality of sealing holes 12 arranged linearly. The leads 14 are inserted through the sealing holes 12 in the metallic outer ring 13. The metallic outer ring 13 includes pairs of cavities 13a and steps 13b surrounding the respective sealing holes surrounding the respective sealing holes 12. The pairs of the cavities 13a and the steps 13b are formed so as to surround outer peripheries of respective pairs of the insulating materials 15 sealing the leads 14 and the sealing holes 12 in the metallic outer ring 13, respectively. Every pair of the cavity 13a and the step 13b is formed such that part of the metallic outer ring 13 protrudes and a back side of the protruding part constitutes a cavity having a recessed surface. When the airtight terminal 10 is attached to an airtight container of an electric compressor, the cavities 13a and the steps 13b are formed so as to protrude beyond a flat surface of the metallic outer ring 13. Even if screw fastening causes distortion to the flat surface of the metallic outer ring 13 when the airtight terminal is fixed to an attachment part of the electrical device by screw fastening or other means, all the insulating materials 15 sealing the gaps between the sealing holes 12 and the leads 14 are disposed inside zones surrounded by the respective pairs of the cavities 13a and the steps 13b and thus a wall surface of each pair of the cavity 13a and the step 13b formed in the metallic outer ring 13 is bended to elastically absorb distortion stress caused in the metallic outer ring 13 and lessen the distortion stress. This prevents the distortion stress caused in the metallic outer ring 13 from propagating to the insulating materials 15 hermetically sealing the gaps between the leads 14 and the metallic outer ring 13 and thus avoids a crack or a fracture in the insulating materials 15.

As illustrated in FIGS. 2A to 2D, an airtight terminal 20 of Example 2 according to the present invention includes a metallic outer ring 23 made of carbon steel, a plurality of leads 24 made of an Fe—Cr iron-base alloy, and insulating materials 25 made of soda barium glass to seal gaps between the metallic outer ring 23 and the respective leads 24. The metallic outer ring 23 has through holes 21 formed for screw fastening and a plurality of sealing holes 22 arranged linearly. The leads 24 are inserted through the sealing holes 22 in the metallic outer ring 23. The metallic outer ring 23 includes a cavity 23a and a step 23b each surrounding the sealing holes. The cavity 23a and the step 23b are formed so as to surround outer peripheries of the insulating materials 25 sealing the leads 24 and the sealing holes 22 as a whole in the metallic outer ring 23. The cavity 23a and the step 23b are formed such that part of the metallic outer ring 23 protrudes and a back side of the protruding part constitutes a cavity having a recessed surface. When the airtight terminal 20 is attached to an airtight container of an electric compressor, the cavity 23a and the step 23b are formed so as to protrude beyond a flat surface of the metallic outer ring 23. Even if screw fastening causes distortion to the flat surface of the metallic outer ring 23 when the airtight terminal is fixed to an attachment part of the electrical device to which the airtight terminal is attached by screw fastening or other means, the insulating materials 25 sealing the gaps between the sealing holes 22 and the leads 24 are disposed inside a zone surrounded by the cavity 23a and the step 23b and thus distortion stress from the metallic outer ring 23 is elastically absorbed and is lessened by being bended a protruding wall surface formed by the cavity 23a and the step 23b to prevent the distortion stress from propagating to the insulating materials 25 hermetically sealing the gaps between the leads 24 and the metallic outer ring 23.

In either of the airtight terminal 10 of Example 1 and the airtight terminal 20 of Example 2, as illustrated in FIG. 8, the protruding surface of the cavity 83a may be used as a part to which the gasket 88 and the airtight container 89 of an electrical device are attached. This allows the cavity 83a to double as a guide for positioning the gasket 88.

As illustrated in FIGS. 3A to 3D, an airtight terminal 30 of Example 3 according to the present invention includes a metallic outer ring 33 made of carbon steel, a plurality of leads 34 made of an Fe—Cr iron-base alloy, and insulating materials 35 made of soda barium glass to seal gaps between the metallic outer ring 33 and the respective leads 34. The metallic outer ring 33 has a plurality of through holes 31 formed for screw fastening and a plurality of sealing holes 32 arranged linearly. The leads 34 are inserted through the sealing holes 32 in the metallic outer ring 33. The metallic outer ring 33 includes grooves 36 surrounding the respective sealing holes 32. The grooves 36 are formed so as to surround outer peripheries of respective pairs of the insulating materials 35 sealing the leads 34 and the sealing holes 32 in the metallic outer ring 33, respectively. When the airtight terminal 30 is attached to an airtight container of an electric compressor, the grooves 36 are each formed such that part of a flat surface of the metallic outer ring 33 is cut out. Even if screw fastening causes distortion to the flat surface of the metallic outer ring 33 when the airtight terminal is fixed to an attachment part of the electrical device to which the airtight terminal is attached by screw fastening or other means, the insulating materials 35 sealing the gaps between the sealing holes 32 and the leads 34 are disposed inside zones surrounded by the respective grooves 36 and thus a surface of an inner wall including a bottom of each of the grooves are bended to elastically absorb distortion stress caused in the metallic outer ring 33 and lessen the distortion stress. This prevents the distortion stress caused in the metallic outer ring 33 from propagating to the insulating materials 35 hermetically sealing the gaps between the leads 34 and the metallic outer ring 33 and thus avoids a crack or a fracture in the insulating materials 35.

As illustrated in FIGS. 4A to 4D, an airtight terminal 40 of Example 4 according to the present invention includes a metallic outer ring 43 made of stainless steel, a plurality of leads 44 made of an Fe—Cr iron-base alloy, and insulating materials 45 made of soda barium glass to seal gaps between the metallic outer ring 43 and the respective leads 44. The metallic outer ring 43 has a plurality of through holes 41 formed for screw fastening and a plurality of sealing holes 42 arranged linearly. The leads 44 are inserted through the sealing holes 42 in the metallic outer ring 43. The metallic outer ring 43 includes a groove 46 surrounding the sealing holes 42. The groove 46 is formed so as to surround outer peripheries of the insulating materials 45 sealing the leads 44 and the sealing holes 42 as a whole in the metallic outer ring 43. When the airtight terminal 40 is attached to an airtight container of an electric compressor, the groove 46 is formed such that part of a flat surface of the metallic outer ring 43 is cut out. Even if screw fastening causes distortion to the flat surface of the metallic outer ring 43 when the airtight terminal is fixed to an attachment part of the electrical device to which the airtight terminal is attached by screw fastening or other means, all the insulating materials 45 sealing the gaps between the sealing holes 42 and the leads 44 are disposed inside a zone surrounded by the groove 46 and thus distortion stress from the metallic outer ring 43 is elastically absorbed and is lessened by being bended an inner wall surface of the groove 46 to prevent the distortion stress from propagating to the insulating materials 45 hermetically sealing the gaps between the leads and the metallic outer ring 43.

As illustrated in FIGS. 5A to 5C, an airtight terminal 50 of Example 5 according to the present invention has a steel-made metallic outer ring 53 having a cup shape and including, as one body, a top plate 53a, a cylindrical portion 53b extending downward from an outer peripheral end of the top plate 53a, a flange 53c widening obliquely outward from a lower end of the cylindrical portion 53b, and three small tubular portions 53d forming sealing holes 52 for respective leads made of an Fe—Cr iron-base alloy and extending internally into the cup-shaped metallic outer ring from the top plate 53a, and the leads 54 that are sealed in the lead sealing holes 52 in the circular metallic outer ring 53 with respective insulating materials 55 made of soda barium glass. A height L1 of the cylindrical portion 53b is 7 mm to 15 mm, and an overall height L2 from a bottom face of the flange 53c to an external end of the top plate 53 is 10 mm to 18 mm. The cylindrical portion 53b that is greater in height than the conventional cylindrical portion allows the airtight terminal to be attached to a case of a compressor, with the glass sealed places of the terminal kept apart from the case. The metallic outer ring 53 absorbs distortion stress caused by deformation of an airtight container to prevent the distortion stress from propagating to the glass insulating materials 55.

As illustrated in FIGS. 6A to 6D, an airtight terminal 60 of Example 6 according to the present invention includes a metallic outer ring 63 made of stainless steel, a plurality of leads 64 made of an Fe—Cr iron-base alloy, and insulating materials 65 made of soda barium glass to seal gaps between the metallic outer ring 63 and the respective leads 64. The metallic outer ring 63 has a plurality of through holes 61 formed for screw fastening and a plurality of sealing holes 62 arranged linearly. The leads 64 are inserted through the sealing holes 62 in the metallic outer ring 63. The metallic outer ring 63 includes an extended portion 67 having a shape of a frame or a beam and extending partially or entirely on an outer periphery of the metallic outer ring 63 surrounding the sealing holes 62. The extended portion 67 in the shape of a frame is formed in a zone contiguous to outer peripheries of both the insulating materials 65 sealing the leads 64 and the sealing holes 62 in the metallic outer ring 63. When the airtight terminal 60 is attached to an airtight container of an electric compressor, the extended portion 67 reinforces the metallic outer ring 63 by presenting a reaction to a deformation in a direction along a flat surface of the metallic outer ring. Even if screw fastening causes distortion to the flat surface of the metallic outer ring 63 when the airtight terminal is fixed to an attachment part of an electrical device to which the airtight terminal is attached by screw fastening or other means, the leads 64 and the insulating materials 65 are disposed inside the extended portion 67, and this prevents the distortion from propagating to the insulating materials.

As illustrated in FIGS. 7A to 7D, an airtight terminal 70 of Example 7 according to the present invention includes a metallic outer ring 73 made of stainless steel, a plurality of leads 74 made of an Fe—Cr iron-base alloy, and insulating materials 75 made of soda barium glass to seal gaps between the metallic outer ring 73 and the respective leads 74. The metallic outer ring 73 has a plurality of through holes 71 formed for screw fastening and a plurality of sealing holes 72 arranged linearly. The leads 74 are inserted through the sealing holes 72 in the metallic outer ring 73. The metallic outer ring 73 includes pairs of cavities 73a and steps 73b surrounding the respective sealing holes 72 and an extended portion 77 having a shape of a frame or a beam and extending partially or entirely on an outer periphery of the metallic outer ring 73. The cavities 76 are formed so as to surround outer peripheries of respective pairs of the insulating materials 75 sealing the leads 74 and the sealing holes 72 in the metallic outer ring 73. The cavities 76 and the extended portion 77 are included in the metallic outer ring 73 when the airtight terminal 70 is attached to an airtight container of an electric compressor. Even if screw fastening causes distortion to a flat surface of the metallic outer ring 73 when the airtight terminal is fixed to an attachment part of an electrical device to which the airtight terminal is attached by screw fastening or other means, the sealing holes 72 and all the insulating materials 75 sealing the leads 74 are disposed inside zones surrounded by the respective cavities 76 and the metallic outer ring is reinforced by the extended portion 77. Thus, distortion stress from the metallic outer ring 73 does not cause the cavities 76 to be excessively deformed and loose effect. As a result, the distortion stress is elastically absorbed and is lessened by being bended an inner wall surface of each of the cavities 76 to prevent the distortion stress from propagating to the insulating materials 75 hermetically sealing the gaps between the leads 74 and the metallic outer ring 73.

A metal surface of the airtight terminal according to the present invention may be additionally plated with a desired coat after the leads are sealed with glass in the metallic outer ring. The metallic outer ring described above may be made of any metallic material. Further, the leads may be made of any metallic material having electrical conductivity, and the metallic material is not limited to the Fe—Cr alloy but may be, for example, changed appropriately to another material such as an Fe—Ni alloy, carbon steel, a copper alloy, or an aluminum alloy. Likewise, the insulating material described above may be made of any glass material other than soda barium glass, with the proviso that the material is capable of electrically insulating the leads and the metallic outer ring from each other and hermetically sealing gaps between the leads and the metallic outer ring. The insulating material according to the present invention may be partly made of glass materials that differ from each other as needed. The glass material may also be replaced, in part or in whole, with a resin material such as an epoxy resin as needed. The glass of the insulating material may be partly replaced with a molded part composed of an elastic body such as silicone rubber or refrigerant-resistant rubber other than glass, so that the insulating material is a composite material that combines glass and the molded part. For instance, the insulating material may be a composite material such that an inner space of the sealing hole from a substantially central part to a midway part not reaching an opening end of the sealing hole is sealed with glass and at least a remaining inner space of the sealing hole up to the opening end is filled with an elastic body of silicone rubber or refrigerant-resistant rubber.

Any one of the airtight terminals described above in the Examples constitutes a part of an airtight container. The airtight container includes a container body to have at least an electrical device such as an electric compressor built-in and an airtight terminal that is inserted into and attached to an opening formed in an outer wall surface of the container body to hermetically close the opening and electrically connected to the electrical device to supply electric power to the electrical device from an outside. The airtight terminal includes a metallic outer ring, having a through hole formed for screw fastening, and a sealing hole, a lead inserted through the sealing hole in the metallic outer ring, and an insulating material configured to seal a gap between the metallic outer ring and the lead. The metallic outer ring also includes either of a step having a cavity and a groove formed around the sealing hole. By covering the opening formed in the outer wall surface of the container body, which has the electrical device such as an electric compressor built-in, with the airtight terminal and fastening the airtight terminal to the opening with a screw or resistance welding, the airtight container closes and hermetically seals a gap between the Metallic outer ring and the opening of the container body to ensure airtightness of the container body while supplying electric power to the electrical device inside the container body. Hence, even if screw fastening or resistance welding causes distortion to a flat surface of the metallic outer ring 53 when the airtight terminal is fixed to the opening in the electrical device by screw fastening, resistance welding, or other means, the insulating material sealing the gap between the sealing hole and the lead in the airtight terminal is disposed inside a zone surrounded by a pair of the cavity and the step or the groove and thus distortion stress from the metallic outer ring is elastically absorbed and is lessened by being bended the pair of the cavity and the step or the groove. This allows the airtight container to provide increased mechanical strength and the electrical device to have improved robustness. The airtight terminal can be completely attached to the airtight container readily and quickly only by inserting and attaching the airtight terminal to the opening of the airtight container and fastening the airtight terminal and the airtight container together with a screw after the lead inside the airtight container is electrically connected to the built-in electrical device.

There is an airtight container to which the airtight terminal 50 of Example 5 is applied. In other words, the airtight container includes a container body to have at least an electrical device such as an electric compressor built-in and an airtight terminal that is inserted into and attached to an opening formed in an outer wall surface of the container body to hermetically close the opening and electrically connected to the electrical device to supply electric power to the electrical device from an outside. The airtight terminal has a metallic outer ring having a cup shape and including, as one body, a top plate, a cylindrical portion extending downward from an outer peripheral end of the top plate, a flange widening obliquely outward from a lower end of the cylindrical portion, and a small tubular portion forming a sealing hole for a lead and extending internally into the cup-shaped metallic outer ring from the top plate, and the lead that is sealed in the sealing hole for the lead in the metallic outer ring with an insulating material. A ratio of a height L1 of the cylindrical portion to an overall height L2 of the metallic outer ring from a bottom face of the flange to the top plate, when the overall height L2 is 1, preferably ranges from 0.7 to 0.9 inclusive and more preferably ranges from 0.7 to 0.8 inclusive. The airtight terminal is attached to an airtight container of a compressor by screw fastening or resistance welding and is used. The metallic outer ring absorbs distortion stress caused by deformation of the airtight container to prevent the distortion stress from propagating to the insulating material and hinders occurrence of a fault such as a crack or a chip in the insulating material. If the ratio of the height L1 of the cavity is lower than 0.7, the distance from the case of the compressor is short, and hence the insulating material is affected by stress owing to deformation of the airtight container. If the ratio of the height L1 of the cavity is higher than 0.9, a thickness of the flange is relatively thin, and the airtight terminal may be unable to satisfactorily withstand welding or screw fastening. The higher ratio can cause an amount of an outward protruding part of the metallic outer ring to be excessive such that the protruding part constitutes an obstacle and can result in waste such as an unnecessarily long lead inside the cavity.

There is an airtight container to which the airtight terminal 60 of Example 6 is applied. In other words, the airtight container includes a container body to have at least an electrical device such as an electric compressor built-in and an airtight terminal that is inserted into and attached to an opening formed in an outer wall surface of the container body to hermetically close the opening and electrically connected to the electrical device to supply electric power to the electrical device from an outside. The airtight terminal includes a metallic outer ring having a through hole and a sealing hole, a lead inserted through the sealing hole in the metallic outer ring, and an insulating material configured to seal a gap between the metallic outer ring and the lead. The metallic outer ring includes an extended portion extending partially or entirely on an outer periphery of the metallic outer ring surrounding, the sealing hole.

The airtight container to which the airtight terminal 60 of Example 6 is applied may be an airtight container in which the metallic outer ring further includes a cavity 73*a* and a step 73*b* surrounding the sealing hole illustrated in FIGS. 7A to 7D (or a cavity 23*a* and a step 23*b* illustrated in FIGS. 2A to 2D) or a groove 36 illustrated in FIGS. 3A to 3D (or a groove 46 illustrated in FIGS. 4A to 4D).

In the airtight container, a ratio of the height L1 of the cavity to the overall height L2 of the metallic outer ring from a bottom face of the flange to an external end face of the cavity preferably ranges from 0.7 to 0.9 inclusive and more preferably ranges from 0.7 to 0.8 inclusive when the overall height L2 is 1. The ratio of the height L1 of the cavity is set to a ratio within the range described above to prevent the insulating material from being affected by stress owing to deformation of the case of the compressor.

In the airtight container, the cavity can double as a guide for positioning a gasket.

INDUSTRIAL APPLICABILITY

The present invention can be applied to general airtight terminals including an airtight terminal for automotive application.

LIST OF REFERENCE SIGNS

10 airtight terminal,
11 through hole,
12 sealing hole,
13 metallic outer ring,
13*a* cavity,
13*b* step,
13*c* flange,
14 lead,
15 insulating material,
20 airtight terminal,
21 through hole,
22 sealing hole,
23 metallic outer ring,
23*a* cavity,
23*b* step,
23*c* flange,
24 lead,
25 insulating material,
30 airtight terminal,
31 through hole,
32 sealing hole,
33 metallic outer ring,
34 lead,
35 insulating material,
36 groove,
40 airtight terminal,
41 through hole,
42 sealing hole,
43 metallic outer ring,
44 lead,
45 insulating material,
46 groove,
50 airtight terminal,
52 sealing hole,
53 metallic outer ring,
53*a* top plate,
53*b* cylindrical portion,
53*c* flange,
53*d* small tubular portion,
54 lead,
55 insulating material,
60 airtight terminal,
61 through hole,
62 sealing hole,
63 metallic outer ring,
73*a* cavity,
73*b* step,
73*c* flange,
64 lead,
65 insulating material,
67 extended portion,
70 airtight terminal,
71 through hole,
72 sealing hole,
73 metallic outer ring,
74 lead,
75 insulating material,
77 extended portion,
80 airtight terminal,
83 metallic outer ring,
83*a* cavity,
84 lead,
85 insulating material,
88 gasket,
89 airtight container

The invention claimed is:

1. An airtight terminal comprising:
    a metallic outer ring having at least one sealing hole, wherein the metallic outer ring has a flat surface;
    a lead inserted through the sealing hole in the metallic outer ring; and
    an insulating material configured to seal a gap between the metallic outer ring and the lead,
    wherein the metallic outer ring includes a step having a cavity formed around the sealing hole, and
    wherein the step and the cavil are formed so as to surround an outer periphery of the insulating material and further protrude beyond the flat surface of the metallic outer ring.

2. The airtight terminal according to claim 1, wherein the metallic outer ring elastically absorbs distortion stress caused in the metallic outer ring by the cavity and the step being bended.

3. The airtight terminal according to claim 1, wherein the metallic outer ring further has a through hole formed for screw fastening.

4. The airtight terminal according to claim 1, wherein the metallic outer ring has a plurality of the sealing holes arranged linearly.

5. An airtight terminal comprising:
    a metallic outer ring having at least one sealing hole, wherein the metallic outer ring has a flat surface;
    a lead inserted through the sealing hole in the metallic outer ring; and
    an insulating material configured to seal a gap between the metallic outer ring and the lead, wherein the metallic outer ring includes a groove formed around the sealing hole, and wherein the groove is formed such that a cart of the flat surface of the metallic outer ring is cut out.

6. The airtight terminal according to claim 5, wherein the metallic outer ring elastically absorbs distortion stress caused in the metallic outer ring the groove by being bended.

7. The airtight terminal according to claim 5, wherein the groove is formed into a continuous circular circumference so as to surround the sealing hole without a gap.

8. The airtight terminal according to claim 5, wherein the groove consists of a plurality of arc-shaped grooves disposed so as to surround the sealing hole intermittently.

9. The airtight terminal according to claim 5, wherein the metallic outer ring further has a through hole formed for screw fastening.

10. The airtight terminal according to claim 5, wherein the metallic outer ring has a plurality of the sealing holes arranged linearly.

11. An airtight terminal comprising:
a metallic outer ring having a cup shape and including, as one body, a top plate, a cylindrical portion extending downward from an outer peripheral end of the top plate, a flange widening obliquely outward from a lower end of the cylindrical portion, and a small tubular portion forming a sealing hole for a lead and extending internally into the cup-shaped metallic outer ring from the top plate; and
the lead that is sealed in the sealing hole for the lead in the metallic outer ring with an insulating material, wherein a ratio of a height of the cylindrical portion to an overall height from a bottom face of the flange to the top plate ranges from 0.7 to 0.9 inclusive when the overall height is 1.

12. An airtight terminal comprising:
a metallic outer ring having a through hole and a sealing hole;
a lead inserted through the sealing hole in the metallic outer ring; and
an insulating material configured to seal a gap between the metallic outer ring and the lead, wherein the metallic outer ring includes an extended portion extending partially or entirely on an outer periphery of the metallic outer ring surrounding the sealing hole, and wherein the extended portion has a shape of a frame or a beam.

13. The airtight terminal according to claim 12, wherein the metallic outer ring further includes a cavity surrounding the sealing hole.

14. The airtight terminal according to claim 13, wherein a ratio of a height of the cavity to an overall height from a bottom face of the metallic outer ring to an external end face of the cavity ranges from 0.7 to 0.9 inclusive when the overall height is 1.

15. The airtight terminal according to claim 13, wherein the cavity is configured to work also as a guide for positioning a gasket.

16. An airtight container comprising:
a container body to have at least an electrical device such as an electric compressor built-in; and
an airtight terminal that is inserted into and attached to an opening formed in an outer wall surface of the container body to hermetically close the opening and electrically connected to the electrical device to supply electric power to the electrical device from an outside, the airtight terminal comprising:

a metallic outer ring having a sealing hole and a step having a cavity formed around the sealing hole, wherein the metallic outer ring has a flat surface;
a lead inserted through the sealing hole in the metallic outer ring; and
an insulating material configured to seal a gap between the metallic outer ring and the lead, wherein the step and the cavity are formed so as to surround an outer periphery of the insulating material and further protrude beyond the flat surface of the metallic outer ring.

17. The airtight container according to claim 16, wherein the metallic outer ring elastically absorbs distortion stress caused in the metallic outer ring by the cavity and the step being bended.

18. The airtight container according to claim 16, wherein the metallic outer ring further has a through hole formed for screw fastening.

19. The airtight container according to claim 16, wherein the metallic outer ring has a plurality of the sealing holes arranged linearly.

20. An airtight container comprising:
a container body to have at least an electrical device such as an electric compressor built-in; and
an airtight terminal that is inserted into and attached to an opening formed in an outer wall surface of the container body to hermetically close the opening and electrically connected to the electrical device to supply electric power to the electrical device from an outside, the airtight terminal comprising:
a metallic outer ring having a sealing hole and a groove formed around the sealing hole, wherein the metallic outer ring has a flat surface;
a lead inserted through the sealing hole in the metallic outer ring; and
an insulating material configured to seal a gap between the metallic outer ring and the lead, wherein the groove is formed such that a part of the flat surface of the metallic outer ring is cut out.

21. The airtight container according to claim 20, wherein the metallic outer ring elastically absorbs distortion stress caused in the metallic outer ring by the groove being bended.

22. The container according to claim 20, wherein the groove is formed into a continuous circular circumference so as to surround the sealing hole without a gap.

23. The airtight container according to claim 20, wherein the groove consists of a plurality of arc-shaped grooves disposed so as to surround the sealing hole intermittently.

24. The airtight container according to claim 20, wherein the metallic outer ring further has a through hole formed for screw fastening.

25. The airtight container according to claim 20, wherein the metallic outer ring has a plurality of the sealing holes arranged linearly.

26. An airtight container comprising:
a container body to have at least an electrical device such as an electric compressor built-in; and
an airtight terminal that is inserted into and attached to an opening formed in an outer wall surface of the container body to hermetically close the opening and electrically connected to the electrical device to supply electric power to the electrical device from an outside, the airtight terminal comprising:
a metallic outer ring having a cup shape and including, as one body, a top plate, a cylindrical portion extending downward from an outer peripheral end of the top plate, a flange widening obliquely outward from a lower end of the cylindrical portion, and a small tubular portion forming a sealing hole for a lead and extending internally into the cup-shaped metallic outer ring from the top plate; and the lead that is sealed in the sealing hole for the lead in the metallic outer ring with an insulating material, wherein a ratio of a height of the cylindrical portion to an overall height from a bottom face of the flange to the top plate ranges from 0.7 to 0.9 inclusive when the overall height is 1.

27. An airtight container comprising:

a container body to have at least an electrical device such as an electric compressor built-in; and an airtight terminal that is inserted into and attached to an opening formed in an outer wall surface of the container body to hermetically close the opening and electrically connected to the electrical device to supply electric power to the electrical device from an outside, the airtight terminal comprising:

a metallic outer ring having a through hole and a sealing hole;

a lead inserted through the sealing hole in the metallic outer ring; and an insulating material configured to seal a gap between the metallic outer ring and the lead, wherein the metallic outer ring includes an extended portion extending partially or entirely on an outer periphery of the metallic outer ring surrounding the sealing hole, and wherein the extended portion has a shape of a frame or a beam.

28. The airtight container according to claim 27, wherein the metallic outer ring further includes a cavity surrounding the sealing hole.

29. The airtight container according to claim 28, wherein a ratio of a height of the cavity to an overall height from a bottom face of the metallic outer ring to an external end face of the cavity ranges from 0.7 to 0.9 inclusive when the overall height is 1.

30. The airtight container according to claim 28, wherein the cavity is configured to work also as a guide for positioning a gasket.

31. The airtight terminal according to claim 12, wherein the metallic outer ring has a section with a flat surface and the through hole is provided in the section with the flat surface.

* * * * *